US006386889B1

(12) United States Patent
Bishop

(10) Patent No.: US 6,386,889 B1
(45) Date of Patent: May 14, 2002

(54) BOARD-TO-BOARD ELECTRICAL CONNECTORS

(75) Inventor: Peter George Bishop, Cambs (GB)

(73) Assignee: AVX Limited, Suffolk (GB)

( * ) Notice: Subject to any disclaimer, the term of this patent is extended or adjusted under 35 U.S.C. 154(b) by 0 days.

(21) Appl. No.: 09/376,251

(22) Filed: Aug. 18, 1999

Related U.S. Application Data

(63) Continuation of application No. 08/973,765, filed as application No. PCT/GB96/01534 on Jun. 26, 1996, now Pat. No. 5,967,800.

(30) Foreign Application Priority Data

Jul. 4, 1995 (GB) ............................................ 9513540

(51) Int. Cl.[7] .......................... H01R 12/00; H05K 1/00
(52) U.S. Cl. .......................... 439/66; 439/74; 439/630
(58) Field of Search ............................ 439/74, 66, 630

(56) References Cited

U.S. PATENT DOCUMENTS

| | | | |
|---|---|---|---|
| 3,550,062 A | 12/1970 | Drenten et al. | |
| 3,815,077 A | 6/1974 | Anhalt et al. | |
| 3,873,173 A | 3/1975 | Anhalt | |
| 3,960,424 A | 6/1976 | Weisenburger | |
| 3,993,384 A | 11/1976 | Dennis et al. | |
| 4,035,046 A | 7/1977 | Kloth | |
| 4,050,755 A | 9/1977 | Hasircoglu | |
| 4,052,118 A | 10/1977 | Scheingold et al. | |
| 4,057,311 A | 11/1977 | Evans | |
| 4,093,330 A | 6/1978 | Pittman | |
| 4,176,895 A | 12/1979 | Aldridge | |
| 4,188,085 A | 2/1980 | Aldridge et al. | |
| 4,220,383 A | 9/1980 | Scheingold et al. | |
| 4,268,102 A | 5/1981 | Grabbe | |
| 4,341,433 A | 7/1982 | Cherian et al. | |
| 4,359,252 A | 11/1982 | Olsson et al. | |
| 4,494,807 A | 1/1985 | Cosmo | |
| 4,511,201 A | 4/1985 | Baker et al. | |
| 4,553,192 A | 11/1985 | Babuka et al. | |
| 4,623,207 A | * 11/1986 | Sasaki et al. | 439/59 |
| 4,660,920 A | 4/1987 | Shibano | |

(List continued on next page.)

FOREIGN PATENT DOCUMENTS

| | | | |
|---|---|---|---|
| DE | 9112605 | 2/1992 | |
| EP | 0346206 A1 | 12/1989 | |
| EP | 0463487 B1 | 1/1992 | |
| EP | 0568971 A1 | 11/1993 | |
| FR | 93 15633 | * 12/1993 | 439/630 |
| JP | 435363 | 3/1992 | |
| JP | 454111 | 5/1992 | |
| WO | 9415313 | 7/1994 | |

OTHER PUBLICATIONS

Tab A—“Connectors for Mobile Communications”.

Tab B—Proceedings from the Battery Forum in Munich, Germany, Apr. 25, 1995.

Tab C—“Connector Design in Portable Products”; Electronic Product Design, May 1995.

European Search Report dated Oct. 13, 2000.

UK Search Report Dated Feb. 3, 1999.

*Primary Examiner*—Brian Sircus
*Assistant Examiner*—Hae Moon Hyeon
(74) *Attorney, Agent, or Firm*—Dority & Manning

(57) ABSTRACT

An electrical connector for connecting two adjacent printed circuit boards comprising an electrically insulating body on which are mounted connector elements. Each element has a first portion for electrically contacting a part of one board, and a second portion for contacting a part of the adjacent board, so as to provide electrical connection therebetween. The insulating body may lie between the boards to be interconnected. The connector comprises a first face for interaction with a first circuit board and a second bottom-most face for interaction with a second circuit board. Connector elements include a resiliently moveable contact head.

48 Claims, 3 Drawing Sheets

U.S. PATENT DOCUMENTS

| | | | | | |
|---|---|---|---|---|---|
| 4,664,458 | A | | 5/1987 | Worth | |
| 4,806,104 | A | | 2/1989 | Cabourne | |
| 4,927,369 | A | | 5/1990 | Grabbe et al. | |
| 4,995,814 | A | | 2/1991 | Weidler | |
| 4,998,886 | A | | 3/1991 | Werner | |
| 5,041,016 | A | | 8/1991 | Machado et al. | |
| 5,052,943 | A | | 10/1991 | Davis | |
| 5,199,889 | A | | 4/1993 | McDevitt, Jr. | |
| 5,226,826 | A | | 7/1993 | Nillson et al. | |
| 5,230,632 | A | | 7/1993 | Baumberger et al. | |
| 5,234,353 | A | | 8/1993 | Scholz et al. | |
| 5,259,769 | A | | 11/1993 | Cruise et al. | |
| 5,306,163 | A | | 4/1994 | Asakawa | |
| 5,308,252 | A | | 5/1994 | Mroczkowski et al. | |
| 5,310,352 | A | | 5/1994 | Mroczkowski et al. | |
| 5,338,231 | A | * | 8/1994 | Wilhite | 439/660 |
| 5,378,160 | A | | 1/1995 | Yumibe et al. | |
| 5,425,651 | A | * | 6/1995 | Thrush et al. | 439/630 |
| 5,584,713 | A | | 12/1996 | Kato et al. | |
| 5,586,890 | A | | 12/1996 | Braun | |
| 5,800,200 | A | * | 9/1998 | Bricaud et al. | 439/630 |
| 5,980,323 | A | * | 11/1999 | Bricaud et al. | 439/630 |
| 5,980,324 | A | * | 11/1999 | Berg et al. | 439/630 |

* cited by examiner

BOARD-TO-BOARD ELECTRICAL CONNECTORS

CROSS-REFERENCE TO RELATED APPLICATIONS

The present application is a continuation application of U.S. Pat. Ser. No. 08/973,765 filed Dec. 8, 1997, which issued as U.S. Pat. No. 5,967,800 which was based on PCT/G896/01534 filed Jun. 26, 1996.

FIELD OF THE INVENTION

The present invention relates to electrical connectors and more particularly to electrical connectors used to interconnect electronic assemblies such as, for example, printed circuit boards, which are required to be mounted one adjacent another, often, but not necessarily, in a vertically-arranged stack. Such electronic assemblies will be referred to herein as "boards".

BACKGROUND TO THE INVENTION

Apart from hard wiring the boards one to another, prior art methods of interconnecting the boards include the use of edge connectors carried by the boards which engage with complementary fixed connectors within a frame mounting the boards, interconnection being required between the complementary fixed connectors to provide the necessary connections from one board to another.

Such systems are inconvenient and costly, requiring numerous individual component parts, and the assembly of those parts into an interconnection system. In addition, removal or replacement of individual boards of an assembly is likely to difficult and thus introduce further cost in service and maintenance.

It is an object of the present invention to provide an improved means of interconnecting boards as herein defined.

SUMMARY OF THE INVENTION

According to the present invention electrical connection means for interconnecting two physically adjacent boards, as herein defined, comprises an electrically insulating body which mounts one or more electrically conducting elements, each such conducting element having a first portion adapted to electrically contact an electrically conducting part of one board, and a second portion adapted to contact an electrically conducting part of an adjacent board, to provide electrical connection therebetween.

One of said portions may be adapted to be physically attached to the electrically conducting part of its respective board, and the other of said portions to form a pressure contact with the electrically conducting part of the other board.

Alternatively the body of the connector may be physically attached to, or located upon, one or other of the two boards and pressure contact made by both portions of the connector element to the respective conducting parts of the two boards.

In one form of connector in accordance with the invention, the insulating body of the connector may lie between the boards to be interconnected, and connection may be made between contacts carried respectively by the opposed faces of the two boards.

In a further form, the boards to be interconnected may line one upon the other, and connection may be made between contacts carried respectively upon the upper faces of the two boards.

Employing a series of connectors in accordance with the invention, a series of boards may be interconnected in stack without the need for an external mechanical framework or associated interconnections.

It will be apparent that connectors in accordance with the invention provide a more ready and less expensive means of interconnecting adjacent boards one to another, and of creating an interconnected stack of a series of such boards.

BRIEF DESCRIPTION OF DRAWINGS

In order that features and advantages of the present invention may be further appreciated, two embodiments thereof will be described, by way of example, with reference to the accompanying drawings of which.

DETAILED DESCRIPTION OF EMBODIMENTS

Figure 1:
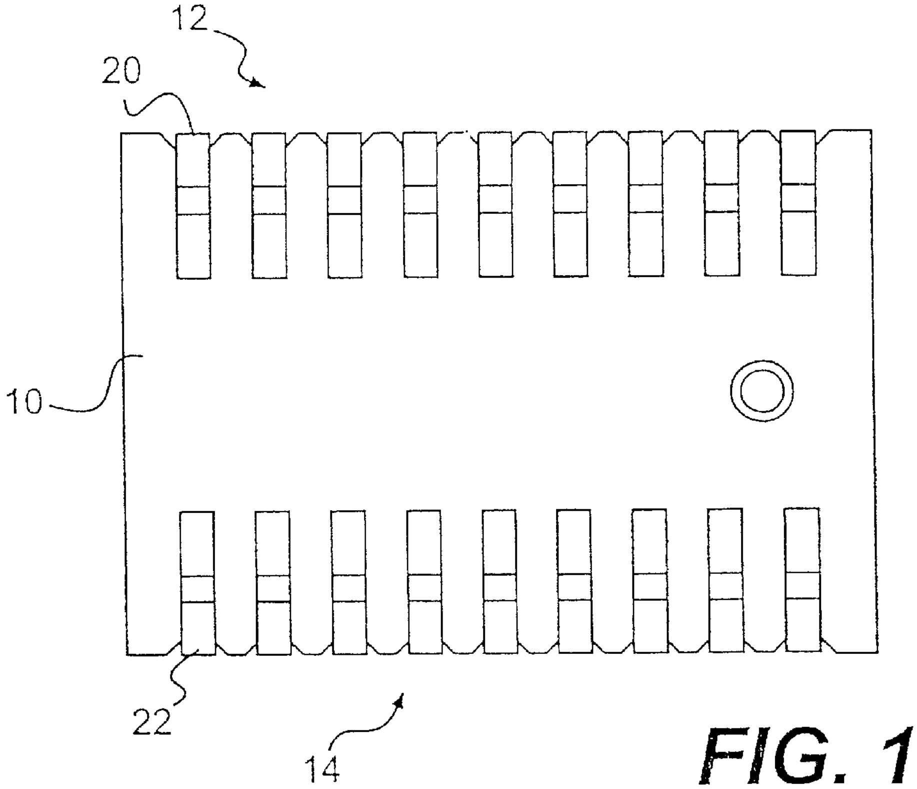
FIG. 1, 2 and 3 show respectively views from the top, side and below of an electrical connector in accordance with the invention.
Figure 2:
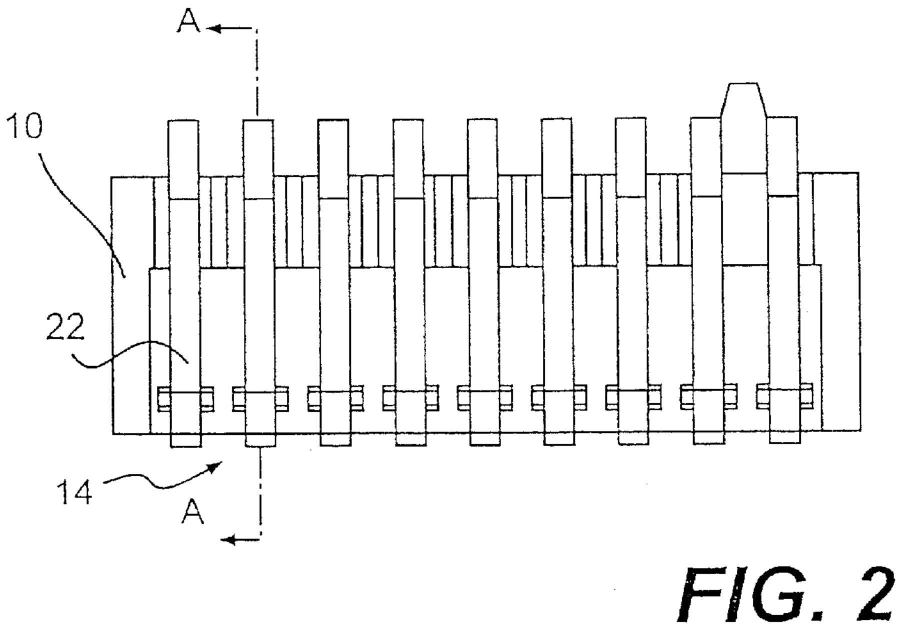
Figure 3:
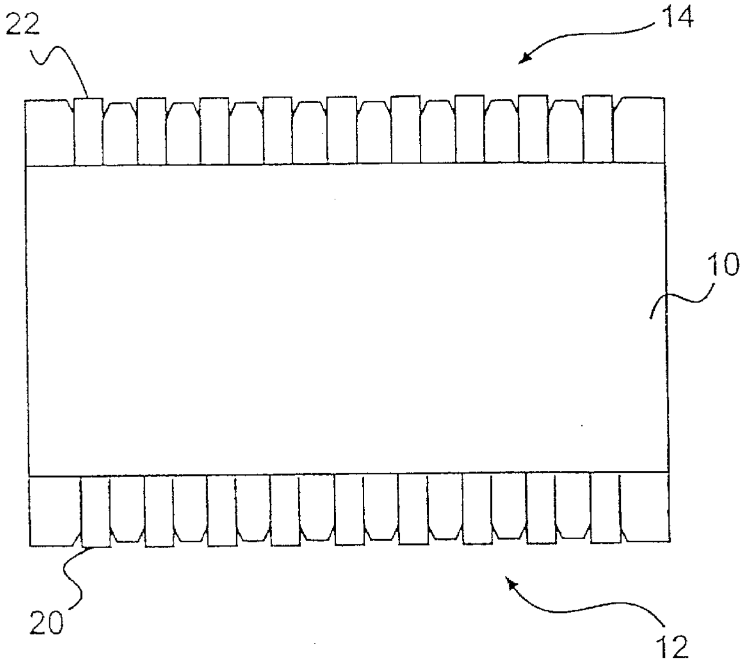
Figure 4:
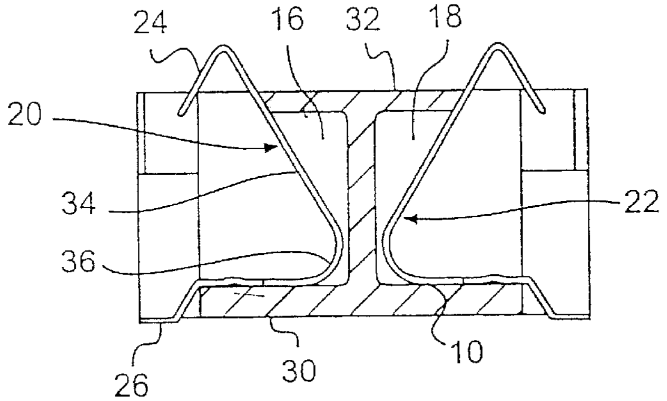
FIG. 4 is a transverse section through the connector of FIGS. 1, 2 and 3, taken along the line 4—4 looking in the direction of the arrows.
Figure 5:
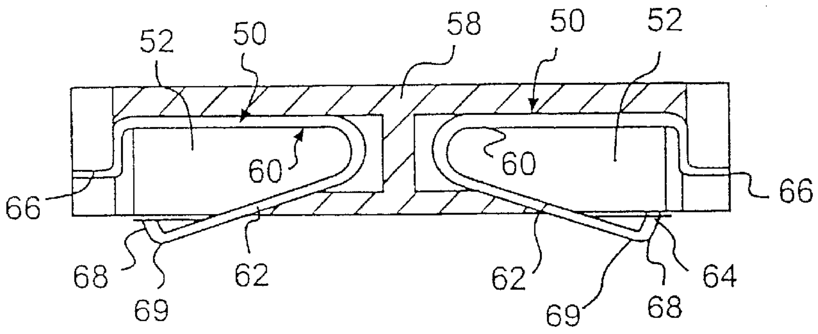
FIG. 5 is a transverse section of another form of connector in accordance with the invention.
Figure 6:
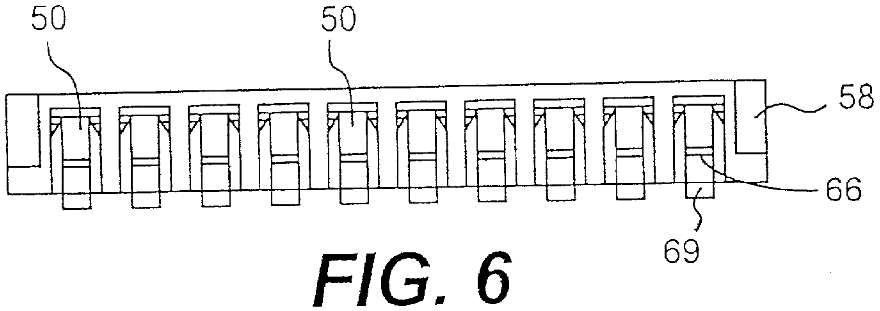
FIGS. 6 & 7 are views of the connector of FIG. 5 from one side and below respectively, on a different scale.
Figure 7:
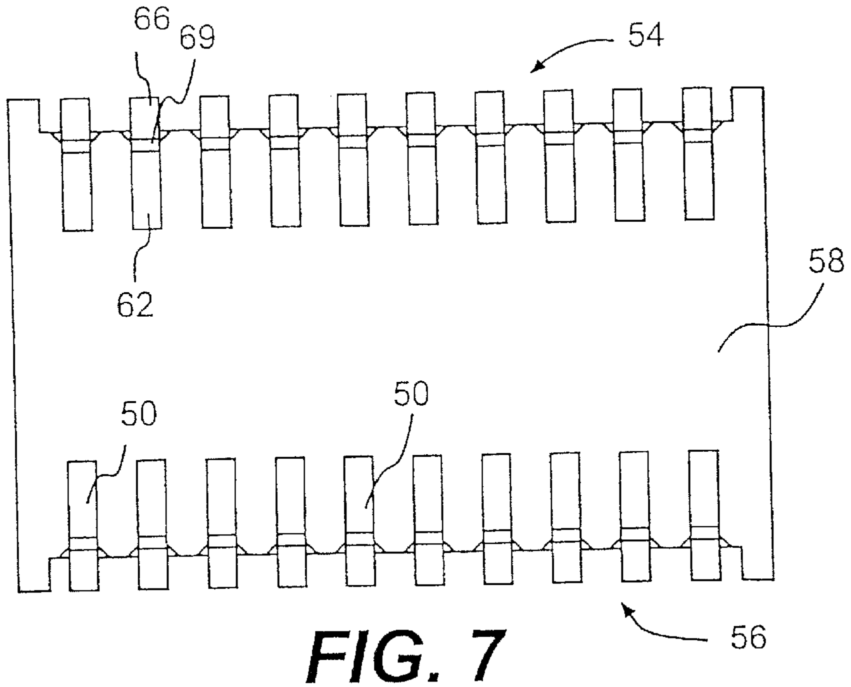

Referring to FIGS. 1 to 4, the first electrical connector comprises a body 10 of electrically insulating material in the form of a plastics mounding, whose opposed longitudinal faces 12 and 14 are each provided with a series of opposed recesses, such as 16 and 18 respectively (see FIG. 4), in which identical contact elements such as 20 and 22 are mounted. Opposed recesses 16 and 18 are bounded by a back wall along the midline of body 10.

The body 10 may typically be moulded of STANYL™ high temperature resistant nylon, and the contact elements 20 formed of beryllium-copper strip material 0.1 mm thick.

Each contact element is shaped to provide a head 24 in the form of an inverted letter V at the upper extremity of the contact element and a flat foot 26 at the lower extremity.

Head 24, which is intended to make pressure contact with a contact pad upon one printed circuit board, is gold plated to optimise electrical contact between contact element 20 and the respective contact pad, carried upon the board to be mounted adjacent the upper face 32 of body 10. A back wall extends between upper face 32 and bottom surface 30.

Foot 26, which is intended to be surface mounted by soldering to a control pad upon the other printed circuit board, is tinned with a tin-lead alloy to permit ready attachment thereto.

Each contact element 20 is shaped and mounted to permit head 24 to flex outwardly and downwardly upon stem 34, about turnover 36, when assembled with a upper printed circuit board, the lower face of which will lie in contact with the upper face 32 of moulding 10, when the upper board is pressed into contact with the connector.

Referring now to the further connector shown in FIGS. 5 to 8 of the drawings, a series of contact elements 50, are mounted within recesses 52 arranged in two opposed rows 54 and 56, one on each side of a body moulding 58 of electrically insulating material.

Each contact element 50 comprises a generally V-shaped portion, one limb 60 of which lies in contact with the upper face of the recess 52, and the other limb 62 partly projects through the aperture slot 64 in the lower face of recess 52.

The end-portion of limb 60 is continued and stepped to provide a foot 66, intended to be surface mounted upon a complementary contact carried by one of two boards to be interconnected, and the end portion 68 of limb 62 is bent upwardly toward the recess 52, to provide a sprung contact face 69 to engage a complementary contact carried by the other of the two boards to be interconnected.

Figure 8:
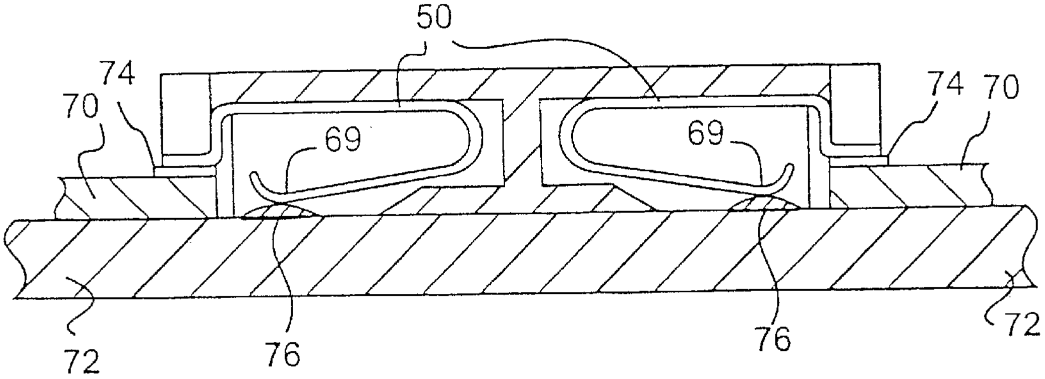
FIG. 8 is a further transverse view of the connector of FIG. 5 assembled with, and interconnecting two boards.

FIG. 8 shows the same connector assembled with a pair of boards 70 and 72, with appropriately positioned contact pads 74 and 76 respectively on the upper surface of each, to permit interconnection by means of the contact elements 50.

The end portion 68 of each contact element 50 projects through aperture 64, and allows contact faces 69 to contact pads 76 upon the upper face of board 72, the lower part of connector body 58 projecting through an appropriately dimensioned aperture in the upper board 70, to mechanically contact the upper face of lower board 72.

It will be appreciated that the connector described in relation to FIGS. 5 to 8 of the drawings will normally be carried upon the upper board 70 by virtue of the contact feet 66 being surface mounted by solder attachment to contact pads 74, and, upon assembly of the two boards 70 and 72, contact faces 69 will engage pads 76 upon the lower board 72. The complete assembly may be held together by appropriately mounting board 70 to board 72, for example by interengaging pegs and apertures, or otherwise.

What is claimed is:

1. An electrical connector for interconnecting at least a first circuit board to a second circuit board, comprising:

an insulating body having an upper portion defining an uppermost substantially flat first face configured for disposition adjacent a face of the first circuit board, a lower portion defining a substantially flat bottommost face, and longitudinal sides, said insulating body further defining adjacently disposed recesses defined in at least one of said sides;

each said recess having a back wall extending between a substantially horizontal bottom surface defined by an inner surface of said lower portion and a substantially horizontal top surface defined by an inner surface of said upper portion, said top surface extending horizontally to a lesser extent than said bottom surface such that each said recess is open at said side body member and at least partially at said upper portion of said body member;

a contact element disposed in each of said recesses, each said contact element having a first end and a second end, and further comprising:

a contact foot defined generally at said second end extending outwardly from said recess and disposed for mounting to the second circuit board;

a generally horizontally mounted portion disposed within said recess and mounted directly against said horizontal bottom surface;

a resiliently movable contact head defined generally at said first end and disposed above a plane of said uppermost first face, said contact head movable towards said uppermost first face upon being pressed into mating contact with the first circuit board; and a flexible stem portion extending between said contact head and said horizontal mounted portion with a turnover section disposed between said flexible stem portion and an end of said horizontally mounted portion generally adjacent said back wall of said recess, said flexible stem portion extending at an angle from said horizontally mounted portion so as to extend past said top surface of said recess such that said contact head extends above said uppermost first face.

2. An electrical connector for interconnecting at least a first circuit board to a second circuit board, comprising:

an insulating body having an upper portion defining an uppermost substantially flat first face configured for disposition adjacent a face of a first circuit board, a lower portion defining a substantially flat bottommost face, and longitudinal sides, said insulting body further defining adjacently disposed recesses defined in at least one of said sides:

each said recess having a back wall extending between a substantially horizontal bottom surface defined by an inner surface of said lower portion and a substantially horizontal top surface defined by an inner surface of said upper portion, said top surface extending horizontally to a lesser extent than said bottom surface such that each said recess is open at said side of body member and at least partially open at said upper surface of said body member;

a connector element disposed in each of said recesses, each said connector element having a first end and second end, and further comprising:

a contact foot defined generally at said second end extending outwardly from said recess and disposed for mounting to a second circuit board;

a generally horizontal mounted portion disposed within said recess and mounted directly against said horizontal bottom surface;

a resiliently movable contact head defined generally at said first end and disposed above a plane of said uppermost first face, said contact head movable towards said uppermost first face upon being pressed into mating contact with the first circuit board; and a flexible stem portion resiliently disposed against said top surface of said recess extending between said contact head and said horizontal mounted portion with a turnover section disposed between said flexible stem portion and an end of said horizontal mounted portion generally adjacent said vertical back wall of said recess, said flexible stem portion extending at an angle from said horizontal mounted portion so as to extend past said top surface of said recess such that said contact head extends above said uppermost first face, said flexible stem portion being resiliently disposed against said top surface of said recess.

3. The electrical connector as in claim 2, wherein said flexible stem portion is generally straight between said turnover section and said contact head.

4. The electrical connector as in claim 2, wherein said flexible stem portion bends back over said horizontal mounted portion only once between said turnover section and said contact head.

5. The electrical connector as in claim 4 wherein said flexible stem portion bends back over said horizontal mounted portion at said turnover section and is generally straight between said turnover section and said contact head.

6.

7. The electrical connector as in claim 2, wherein said contact head is disposed above but not horizontally outward of said horizontal mounted portion such that a vertical line from said contact head intersects said horizontal mounted portion.

8. The electrical connector as in claim 2, wherein said insulating body comprises a row of said adjacently disposed recesses defined in each of said sides with a respective said contact element disposed in each said recess.

9. The electrical connector as in claim 8, wherein said insulating body is generally symmetrical about a plane extending between said rows of adjacently disposed recesses.

10. The electrical connector as in claim 2, wherein said contact foot of each said connector comprises a contacting surface facing in an opposite direction from said contact head.

11. The electrical connector as in claim 10, wherein said bottommost face of said insulating body is configured for disposition adjacent a face of the second circuit board, said contact foot of each said connector extending sufficiently beyond a plane of said bottommost face so that said contact foot making electrical connection with mating pads of the second circuit board upon said bottommost face is disposed directly adjacent the face of the second circuit boards.

12. The electrical connector as in claim 2, wherein said contact foot of each said connector comprises a contacting surface facing in the same direction as said contact head.

13. The electrical connector as in claim 12, wherein said contact foot of each said connector extends outward from said insulating body between planes through said uppermost and bottommost faces so that said contact feet make electrical connection with mating pads of the second circuit board.

14. An electrical connector for mating circuit boards, comprising:

a body having an upper portion defining an uppermost substantially flat first face configured to contact a first circuit board, a lower portion defining a substantially flat bottommost face and sides, said body further comprising adjacently disposed recesses defined disposed along said sides:

a contact element disposed in each of said recesses, each contact element having a first end for mating with a first circuit board and a second end for mating with a second circuit board, each contact element further comprising:

(a) a contact foot defined near said second end extending outwardly from said recess and configured for mounting to the second circuit board;

(b) a generally horizontal mounted portion disposed within said recess and mounted parallel to said horizontal bottom surface;

(c) a resiliently movable contact head defined at said first end of the contact element and disposed above a plane of said uppermost first face, said contact head movable towards said uppermost first face upon being pressed into mating contact with the first circuit board, the contact head having a forwardmost portion at its first end; and (d) a flexible stem portion resiliently disposed against said top surface of said recess extending between said contact head and said horizontal mounted portion with a turnover section disposed between said flexible stem portion and said horizontal mounted portion said flexible stem portion extending at an angle from said horizontal mounted portion, so as to extend past said top surface of said recess such that said contact head extends above said uppermost first face, wherein the forwardmost portion of the contact head extends away from said flexible stem portion and is free from engagement with said upper portion of said body.

15. The electrical connector of claim 20, further wherein said first end of said contact element is configured to assume a position when the connector is unconnected to the first circuit board that provides a vertical location of said contact head at a height that is above the plane of said uppermost first face.

16. The electrical connector of claim 14 wherein the flexible stem portion of the connector element bends back over said horizontal mounted portion at said turnover section and is generally straight between said turnover section and said contact head.

17. The electrical connector of claim 14 wherein the forwardmost portion of the contact head is substantially straight.

18. The electrical connector of claim 14 wherein the contact head is V-shaped.

19. The electrical connector of claim 14 wherein the contact head is curved.

20. The electrical connector of claim 14 which the forwardmost portion of the contact head does not limit the height to which the contact head rises above the plane of the uppermost first face.

21. The electrical connector of claim 14 in which the forwardmost portion of the contact head does not contact any other portion of the electrical connector when said connector is unconnected to a first circuit board.

22. The electrical connector of claim 14 in which the first end of the contact element does not contact any other portion of the electrical connector when said connector is connected to a first circuit board.

23. The electrical connector of claim 14 wherein each said recess comprises a back wall extending between a substantially horizontal bottom surface defined by an inner surface of said lower portion and a substantially horizontal top surface defined by an inner surface of said upper portion, the back wall being defined vertically along the mid-line of the electrical connector, wherein said top surface of the electrical connector extends horizontally and laterally from the mid-line of the connector to a lesser extent than said bottom surface extends laterally from the mid-line, such that each said recess is open at said side of the body member and at least partially open at said upper surface of said body member.

24. The electrical connector of claim 23 in which the flexible stem portion of the contact element is restrained by the top surface of the electrical connector such that the top surface of the electrical connector limits the height the contact head extends above the plane of the uppermost face.

25. The electrical connector of claim 23 in which the flexible stem portion of the connector comprises an upper surface and a lower surface, the upper surface facing towards the midline of the connector, further wherein the upper surface of the flexible stem portion is at least partically inhibited from upward movement by contact with the top surface of the electrical connector.

26. The electrical connector of claim 14 in which a vertical line imposed downward from the first end of the contact element intersects the horizontal mounted portion at a point that is adjacent the contact foot.

27. The electrical connector of claim 14 in which a line extending from, and parallel to, the forwardmost portion of the contact head is directed generally towards said contact foot.

28. An electrical connector for interconnecting at least two circuit boards, comprising:

an insulating body defining a first face configured for disposition adjacent a face of a first circuit board;

a contact element comprising a resiliently movable contact head disposed above a plane through said first face, said contact head being movable towards said first face upon being pressed into mating contact with the first circuit board;

each contact element further comprising a leg portion with a contact foot connected to said leg portion for mating contact with a second circuit board;

wherein said insulating body defines at least one row of adjacently disposed recesses, such that a contact element is disposed in each of said recesses, each contact element comprising a generally V-shaped portion with a first and second limb, said first limb having an end portion, said first limb being in contact with a face of the recess, and said second limb projecting at least in part through an aperture slot located in the opposite face of the recess;

wherein the end portion of the first limb comprises said contact foot extending out of said respective recess for mating contact with said second circuit board and the end portion of said second limb is bent upwardly towards the recess, said end portion being unrestrained by the insulating body, thereby providing a sprung contact face to engage a complementary contact carried by said first circuit board.

29. The connector as in claim 28, wherein said end portion of said second limb is bent once upwardly toward the recess.

30. The connector of claim 28, wherein said end portion of said first limb is bent, thereby providing said contact foot.

31. The connector as in claim 28, wherein the second limb partly projects through an aperture slot of the recess.

32. The connector of claim 28, wherein each contact element comprises a flexible stem portion.

33. The connector of claim 32, wherein each of said contact elements comprises a turnover connecting said flexible stem portion with said first limb, said flexible turnover being disposed within said respective recesses.

34. The connector of claim 32, wherein said contact head comprises a V-shape.

35. The connector of claim 32, wherein the flexible stem portion of each said contact element extends from said leg portion at an angle of other than 90 degrees, wherein upon mating contact with the first circuit board said flexible stem portion moves towards said leg portion.

36. The connector of claim 28, wherein said insulating body is generally symmetrical about a plane extending between rows of adjacently disposed recesses.

37. The connector of claim 28 wherein said contact foot of each contact element comprises a contacting surface facing in an opposite direction from said contact head.

38. The connector of claim 28, wherein the insulating body further comprises a second face generally opposite from said first face and configured for disposition adjacent a face of the second circuit board, said contact foot of each said contact element extending beyond a plane of said second face so that the contact foot makes electrical connection with a mating pad of the second circuit board upon said second face being disposed directly adjacent the face of the second circuit board, said contact element thereby disposed between the first and second circuit boards.

39. The connector of claim 28, wherein said insulating body comprises a second face generally opposite from the first face, said contact foot of each said contact element extending outward from said insulating body between planes through said first face and said second face so that said contact foot makes electrical connection with a mating pad of the second circuit board.

40. The connector of claim 28, wherein said insulating body defines two oppositely facing rows of adjacently disposed recesses.

41. The connector of claim 28, wherein said first face of said insulating body is defined between said rows of recesses and configured for disposition adjacent a face of a first circuit board.

42. The connector of claim 28 wherein said leg portion of said contact element extends out of said respective recess generally opposite from said contact head for mating contact with said second circuit board.

43. The connector of claim 28 wherein said insulating body comprises a generally symmetrical cross-sectional profile through said recesses.

44. The connector of claim 28 wherein said leg portion is set against an inner surface of said insulating body at least partially within said recess.

45. The connector of claim 28 wherein the contact head comprises a configuration so as to define a generally point contact along a width thereof with respect to a mating pad of the first circuit board.

46. The connector of claim 28 wherein said contact foot comprises a generally flat planar contacting surface for planar contact with a mating pad of the second circuit board.

47. The connector of claim 28 wherein one part of the insulating body projects through an appropriately dimensioned aperture in the second circuit board to contact the upper face of the first circuit board.

48. The connector of claim 28 wherein the insulating body of the connector lies between boards to be interconnected, connection being made between contacts carried respectively by the opposed faces of the two boards and the body is physically attached to or located upon one or the other of the two boards.

* * * * *